(12) United States Patent
Jones et al.

(10) Patent No.: US 6,441,691 B1
(45) Date of Patent: Aug. 27, 2002

(54) PLL CYCLE SLIP COMPENSATION

(75) Inventors: Theron Jones, Apex, NC (US); David Homol, Chandler, AZ (US)

(73) Assignee: Ericsson Inc., Research Triangle Park, NC (US)

( * ) Notice: Subject to any disclaimer, the term of this patent is extended or adjusted under 35 U.S.C. 154(b) by 7 days.

(21) Appl. No.: 09/803,604

(22) Filed: Mar. 9, 2001

(51) Int. Cl.[7] .............................. H03L 7/00; G01R 25/00
(52) U.S. Cl. .......................... 331/25; 327/12; 331/156
(58) Field of Search ........................... 331/1 A, 25, 27, 331/17; 455/260, 264; 327/150, 156, 147, 2, 3, 7, 10, 12

(56) References Cited

U.S. PATENT DOCUMENTS

| | | | | |
|---|---|---|---|---|
| 4,030,045 A | * | 6/1977 | Clark | 329/325 |
| 4,620,300 A | * | 10/1986 | Ogawa | 360/40 |
| 4,733,197 A | * | 3/1988 | Chow | 331/1 A |
| 5,790,613 A | * | 8/1998 | Tateishi | 375/317 |

* cited by examiner

Primary Examiner—Robert Pascal
Assistant Examiner—Joseph Chang
(74) Attorney, Agent, or Firm—Coats & Bennett, P.L.L.C.

(57) ABSTRACT

Phase-reset circuits provide first and second frequency-divided input signals to a phase/frequency detector (PFD) used in a phase-locked loop (PLL). The phase-reset circuits receive first and second input signals, with the first input signal usually serving as a reference signal against which the PLL adjusts the second input signal. The PFD generates control signals based on the phase difference between the frequency-divided input signals. Normally, the phase-reset circuits frequency divide the first and second input signals using divisors N and M, respectively. If other circuitry detects that the PFD has missed a clock cycle in the first or second clock-divided input signals, the corresponding phase-reset circuit alters its divider so that the next clock edge on the corresponding input signal clocks through to the PFD. This causes the PFD to quickly set its affected control signal to what it would have been had the clock cycle not been missed.

41 Claims, 8 Drawing Sheets

PLL CYCLE SLIP COMPENSATION

BACKGROUND OF THE INVENTION

The present invention generally relates to frequency synthesis, and particularly relates to PLL-based frequency synthesis.

Radio frequency (RF) communications equipment, such as mobile terminals within a wireless communication system, routinely uses precise frequency reference signals in receive and transmit operations. Often, such reference signals are used to derive additional signals, possibly of higher or lower frequency, but with the stability and accuracy inherent in the reference signal. This frequent need to slave the frequency or timing of one signal to another, or to monitor the phase or frequency difference between two signals, gives rise to specialized circuits, such as the phase-locked loop (PLL).

A general PLL configuration has a controllable oscillator generating an output signal, a detector generating an error signal based on the phase or frequency difference between a feedback signal derived from the output signal and an input reference signal. The PLL generally includes some type of control circuit to adjust the oscillator based on the error signal generated by the detector. In this manner, the oscillator's output signal may be "locked" to the input reference signal. By setting frequency dividing ratios between the reference and the feedback signals, the output signal may be made to have a higher or lower frequency than the input signal. A mobile terminal might generate a stable reference signal with a precisely fixed frequency, and then use a PLL-based frequency synthesizer to generate higher frequency signals used in transmit signal modulation and received signal down conversion.

Although PLL circuits vary widely in their implementation, the detector generally provides one or more output signals that, in general, are driven by the phase or frequency difference between two periodic input signals. Often, these two input signals represent a reference clock signal and an adjustable clock signal that is locked to the reference clock signal by operation of the PLL. When the detector's output signal(s) are generated as a function of the phase difference between the two input signals, the output signals accurately reflect the phase difference between the two input signals only when that difference is within a defined range. Generally, phase detectors used within PLL circuits cannot linearly detect when the phase difference between its two input signals is greater than ±2π radians.

BRIEF SUMMARY OF THE INVENTION

The present invention is a system and method for reducing phase detection error in a phase/frequency detector (PFD) arising from cycle slip. The PFD compares arrival time differences between respective clock edges in two input signals and provides control outputs based on the phase difference between these clock edges. When the, PFD misses a clock edge in either input signal, cycle slip occurs. Phase-reset circuits couple the two input signals to the PFD and operate as input frequency divider circuits, providing the PFD with a sub-harmonic of each input signal. Each phase-reset circuit normally operates as an up (or down) counter, providing one output clock cycle to the PFD for every N input signal clock cycles. When presented with an indication of cycle slip, however, the phase-reset circuit sets its divide-by counter to a value that causes the next input signal clock cycle to produce an output clock cycle. This action results in the cycle slip causing substantially less than the 2π radians per missed cycle of phase error that otherwise manifests itself in the PFD control outputs.

Generally, the PFD operates as part of a PLL and provides an "up" and a "down" control signal to charge pump circuitry that ultimately increases or decreases the control voltage applied to a voltage controlled oscillator. One of the two input signals to the PFD is derived from the VCO's output signal, and the other input signal serves as a reference output signal against which the PLL controls the output signal. By including phase-reset circuits on the front-end of the PFD, the up/down control signal error arising from cycle slip can be reduced substantially. In general, the amount of error reduction depends upon the resolution the phase-reset circuit's digital counter. The reduced cycle slip error allows the PFD to control the associated charge pump circuit such that it remains near its maximum duty cycle for large frequency errors between the two input signals. Operation of the charge pump or pumps within the PLL in this manner tends to reduce the lock time of the PLL, improving overall performance in frequency synthesis functions based on the PLL.

DETAILED DESCRIPTION OF THE INVENTION

Figure 1:
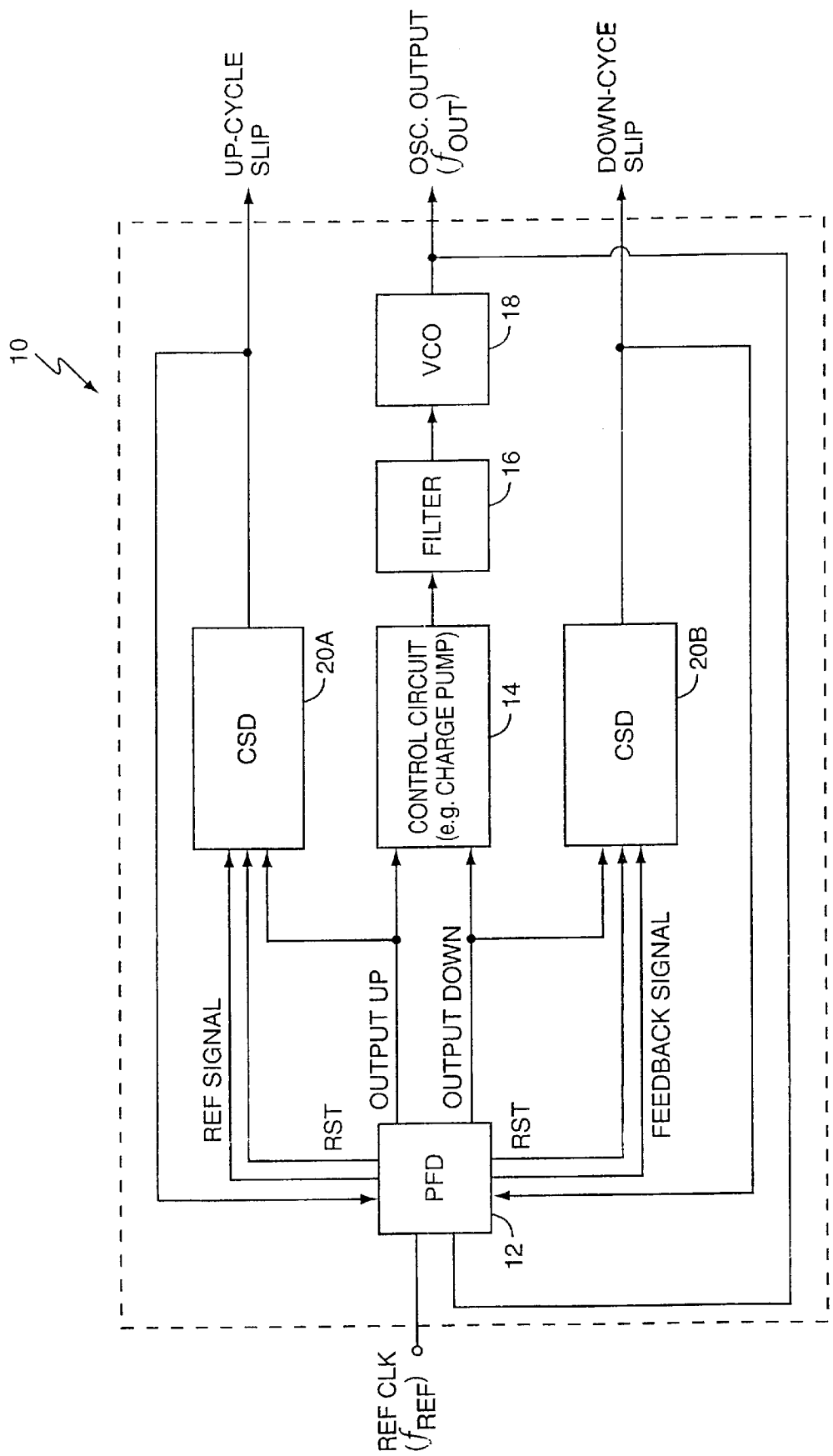
FIG. 1 is a diagram of a phase-locked loop (PLL) including cycle slip compensation in accordance with the present invention.

Turning now to the drawings, FIG. 1 is a diagram of a PLL, generally referred to by the numeral 10. The PLL 10 comprises a phase/frequency detector (PFD) 12, a control circuit 14, a loop filter 16, a voltage-controlled oscillator (VCO) 18, and cycle slip detectors 20A and 20B.

The PFD 12 receives two input signals, a reference clock signal and the output signal from the VCO 18. The output signal from the VCO 18 is made to have a frequency that is a desired multiple or fraction of the reference clock frequency by operation of the PLL 10. The PFD 12 typically generates two output signals, OUTPUT UP and OUTPUT DOWN, to control the control circuit 14. The PFD 12 controls the control circuit 14 via the OUTPUT UP/DOWN signals to adjust the control voltage applied to the VCO 18. The loop filter 16 translates the output from the control circuit 14 into a smoothed, voltage-mode control signal for the VCO 18. In this manner, the frequency of the output signal from the VCO 18 is locked to the frequency of the reference clock.

Figure 2:
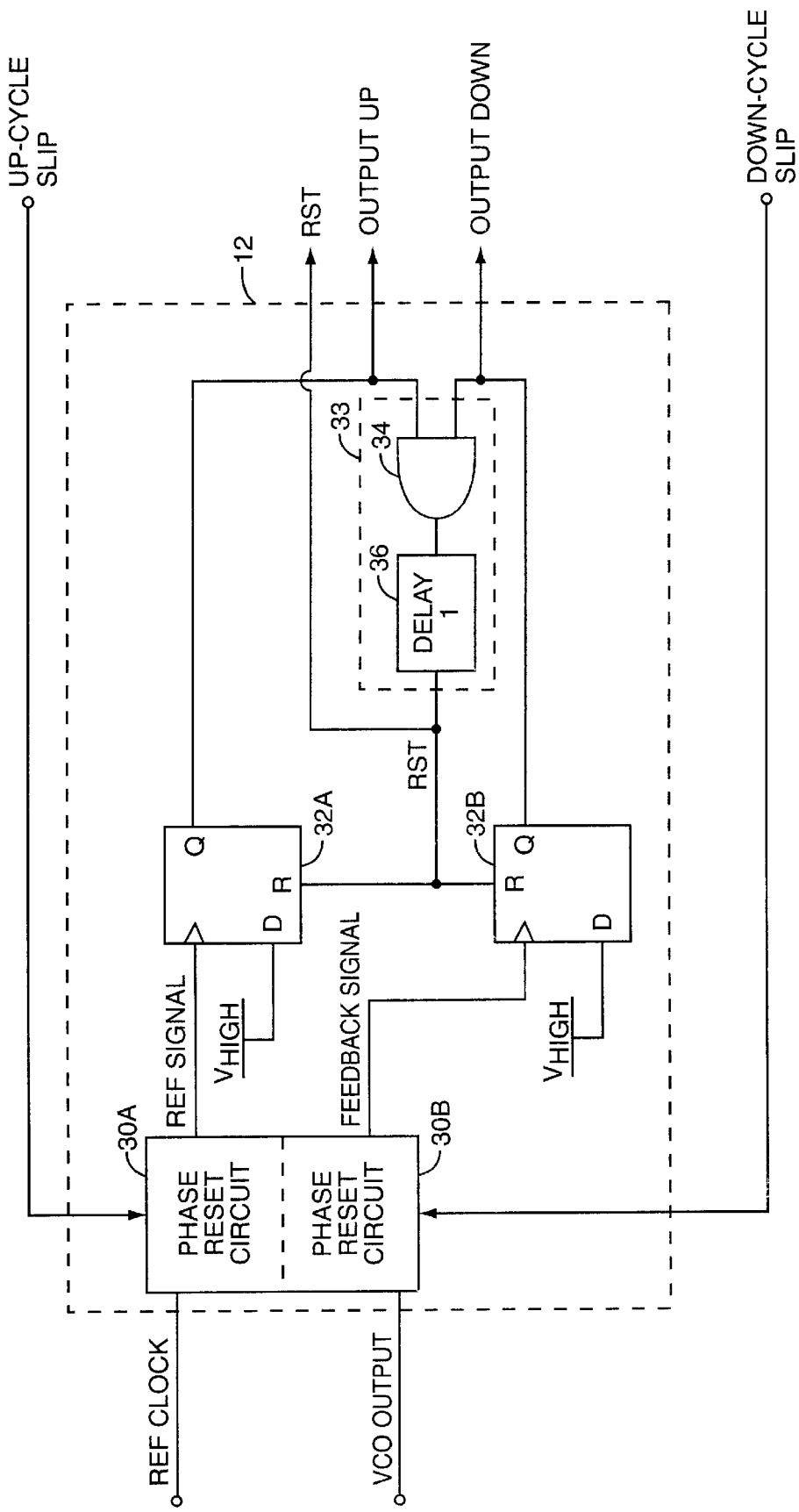
FIG. 2 is a diagram of the phase/frequency (PFD) detector with cycle slip compensation of FIG. 1.

FIG. 2 illustrates the PFD 12, with the PFD 12 comprising phase-reset circuits 30A and 30B and corresponding input flip-flops 32A and 32B, and a PFD reset circuit 33 comprising a logic gate 34 and a delay element 36. In normal operation, the phase-reset circuit 30A functions as an input frequency divider, dividing the reference clock signal to produce a reference signal. Likewise, the phase-reset circuit 30B normally functions as an input signal frequency divider for the VCO output signal, providing a feedback signal to the input flip-flop 32B at a desired sub-harmonic of the VCO output signal. Typically, phase-reset circuits 30A and 30B are digital counters that generate an output pulse once every N input pulses. The phase-reset circuits 30A and 30B will likely be configured with different maximum count values to effect the desired relationship between the frequency of the reference signal and that of the VCO output signal from the VCO 18. For example, the phase-reset circuit 30A might use a divisor value M, while the phase-reset circuit 30B uses a different divisor value N.

During operation, the input flip-flop 32A latches rising edges, termed clock edges, in the reference signal, and the input flip-flop 32B latches clock edges in the feedback signal. Once either input flip-flop 32 latches a clock edge, it is unresponsive to subsequent clock edges in its corresponding input signal until it is reset. The PFD reset circuit 33 uses the logic gate 34 to generate a reset signal (RST) that resets both input flip-flops 32A and 32B once both of them assert their PLL control signals (OUTPUT UP and OUTPUT DOWN). Absent the delay element 36, the RST signal would be asserted immediately after the second of the two input flips 32A or 32B asserted its output signal. While this would allow the PFD 12 to work with input signal phase differences at or near a full $2\pi$ radians, it would cause the minimum pulse width of either OUTPUT UP or OUTPUT DOWN to be too narrow for effective control of the control circuit 14 when the reference and feedback signals have very small phase differences.

Absent the delay element 36, the wider output pulse in either OUTPUT UP or OUTPUT DOWN would be no wider than the arrival time difference between respective clock edges in the reference and feedback signals. The narrower of the two output pulses would only be as wide as the delay of logic gate 34 and the flip-flop reset delay (either 32A or 32B). Which of the two output signals, OUTPUT UP or OUTPUT DOWN, would have this minimum pulse width depends on whether the reference signal leads or lags the feedback signal. By delaying the RST signal a defined period after assertion of the last of the two PFD output signals, the delay element 36 allows the last asserted output signal from the PFD to remain asserted for no less than the delay time of delay element 36. This operation defines the minimum pulse width of output pulses in either OUTPUT UP or OUTPUT DOWN, depending upon the reference signals leads or lags the feedback signal.

When, as is typical, the control circuit 14 of FIG. 1 is implemented as a charge pump circuit, it causes current to flow into the loop filter 16 when the OUTPUT UP signal is asserted. This action raises the DC voltage output by the loop filter 16, causing the VCO 18 to increase the frequency of its output signal. Conversely, the control circuit 14 sinks current from the loop filter 16 when the OUTPUT DOWN signal is asserted, causing the VCO 18 to decrease the frequency of its output signal. Thus, when the reference signal leads the feedback signal, the output pulses in OUTPUT UP are wider than the pulses in OUTPUT DOWN, and the voltage applied to the VCO 18 by the control circuit 14 gradually increases. When the reference signal lags the feedback signal, the pulses in OUTPUT DOWN are wider than the pulses in OUTPUT UP, and the voltage applied to the VCO 18 by the control circuit 14 gradually decreases.

Figure 3:
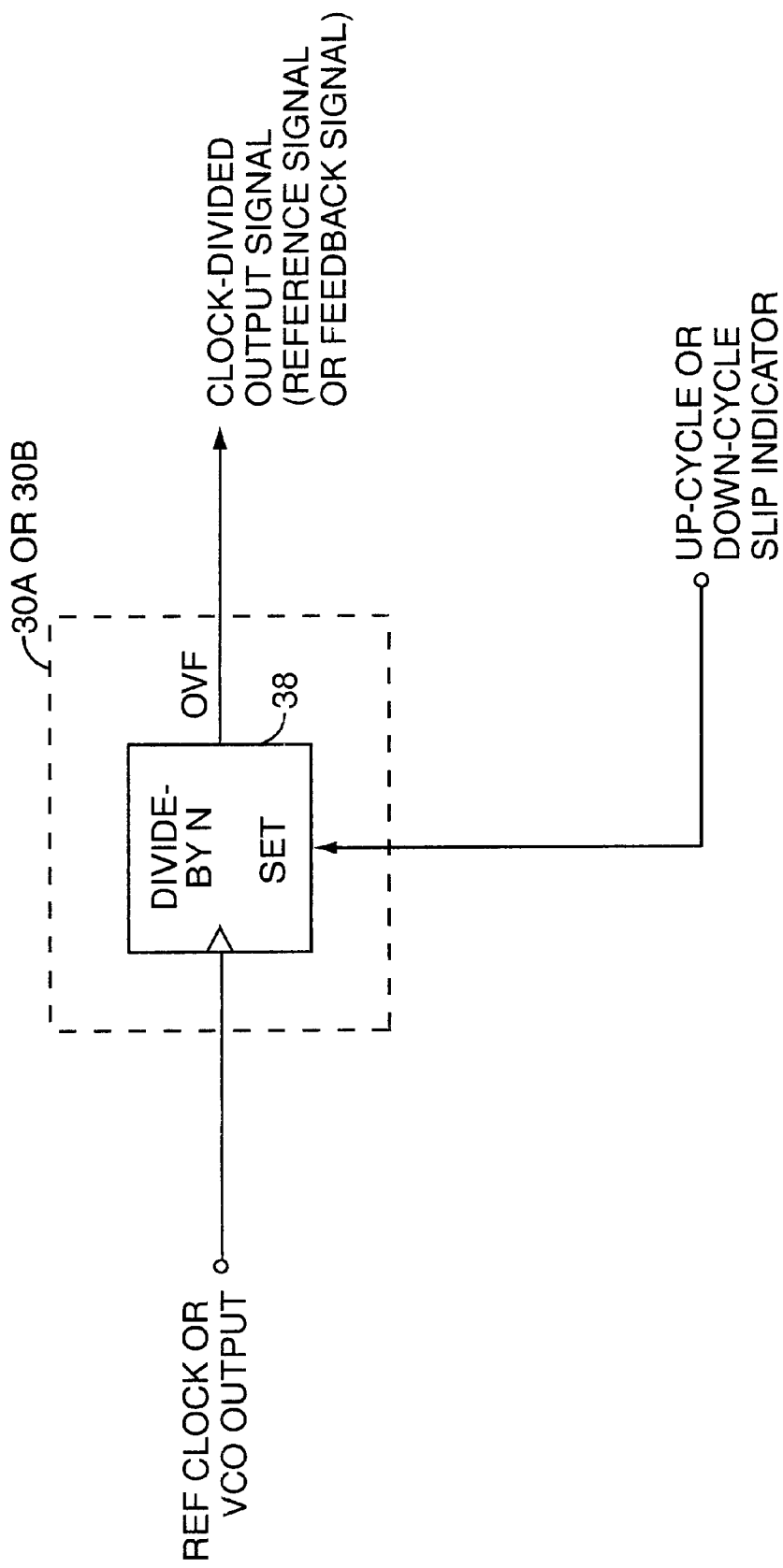
FIG. 3 is a diagram of the phase-reset circuits providing cycle slip compensation within the PFD of FIG. 2.

FIG. 3 is a diagram of the phase-reset circuits 30A and 30B. Each phase-reset circuit 30 comprises a digital counter 38. Note that the digital counter 38 used in the phase-reset circuit 30A will likely have a different number of counter states than that of the digital counter 38 used in the phase reset circuit 30B. This difference arises from the likelihood that the feedback signal is scaled with respect to the output signal differently than the reference signal with respect to the reference clock. Often, the VCO output signal is at a higher frequency than the reference clock signal, so the divisor value N in the phase-reset circuit 30B will be larger than that used in the phase-reset circuit 30A.

In operation, the counter 38 increments or decrements through its N counting states, issuing one output clock pulse for every N input clock pulses in normal operation. Here, normal operation refers to the absence of cycle slips in the PFD 12. When the cycle slip detectors 20 detect that the PFD 12 has missed a clock cycle in either the reference or feedback signals, they assert either the UP-CYCLE SLIP indicator or the DOWN-CYCLE SLIP indicator. In response to the assertion of its cycle slip indicator input, the digital counter 38 in the appropriate phase-reset circuit 30 advances its internal count value to just before or at the counter rollover value. This causes the next clock edge on the corresponding input signal to clock through the counter 38. That is, the counter 38 issues an output clock edge on the next input clock edge. In this context, "advance" means to increment or decrement the count value by the required amount, depending upon whether the counter 38 operates as an up- or down-counter.

Figure 4:
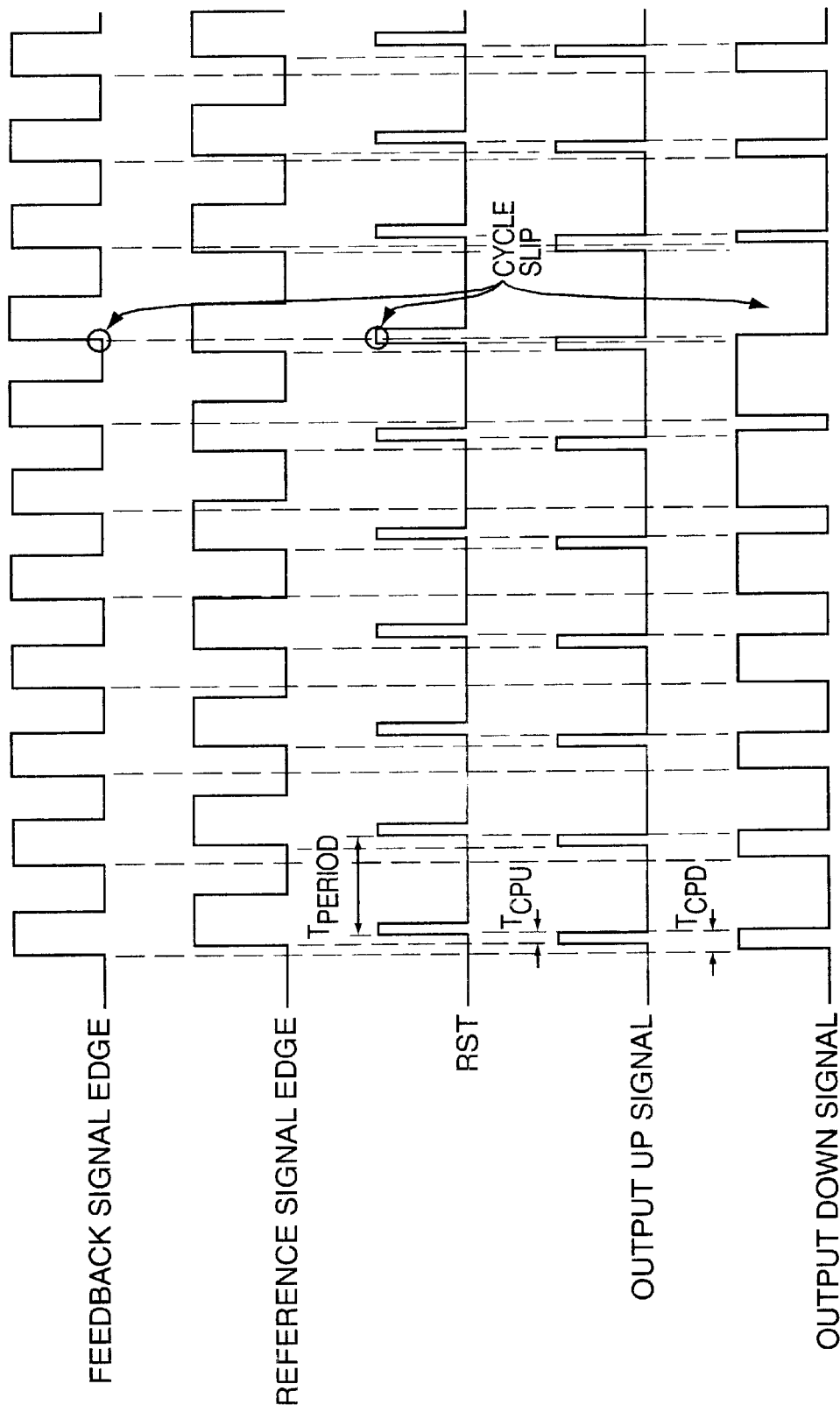
FIG. 4 is a diagram of relevant operating waveforms for the PFD of FIG. 2 without benefit of cycle slip compensation.

FIG. 4 is a collection of time-aligned waveforms, which occur during a typical phase-locking sequence. The waveforms include, from top to bottom, the reference and feedback signals, the PLL control signals OUTPUT UP and OUTPUT DOWN, and the RST signal. While FIG. 4 depicts the reference and feedback signals as output by the phase-reset circuits 30A and 30B, it assumes that the phase-reset circuits 30 operate only as input dividers, rather than as cycle-slip compensators. Thus, FIG. 4 illustrates the problem of cycle slip absent compensation.

Because of their frequency difference, the reference and feedback signals become increasingly out of phase moving from left to right in the diagram. The reference signal lags the feedback signal, so the pulse width of OUTPUT DOWN is determined by the arrival time difference of respective clock edges in the feedback signal and the reference signal, plus the width of the RST pulse. The width of OUTPUT UP, occurring as the last of the two PLL control signals, is simply the width of the RST pulse. At a point where the phase difference between respective clock edges in the reference and feedback signals is about to reach its maximum, the input flip-flop 32B receives a clock edge in the feedback signal while the RST pulse is asserted, causing the PFD 12 to miss this clock edge. The PFD 12 thus misses an entire cycle of the feedback signal during the phase-locking sequence.

The cycle slip error manifests itself in the OUTPUT DOWN signal, which, at the next clock edge of the feedback signal, takes on a very narrow pulse width because the cycle slip causes the phase difference between the reference and feedback signals to falsely appear slight. In other words, if the actual phase difference is $2\pi+x$ radians, the apparent phase difference after cycle slip is simply x. So, at a time when the PFD 12 should operate the OUTPUT DOWN signal essentially at a 100% duty cycle, the cycle slip error causes it to reduce OUTPUT DOWN to at or near the minimum pulse width on the next feedback signal clock edge after the cycle slip. This error increases the time required for the PLL 10 to lock the VCO output signal to the reference signal.

Figure 5:
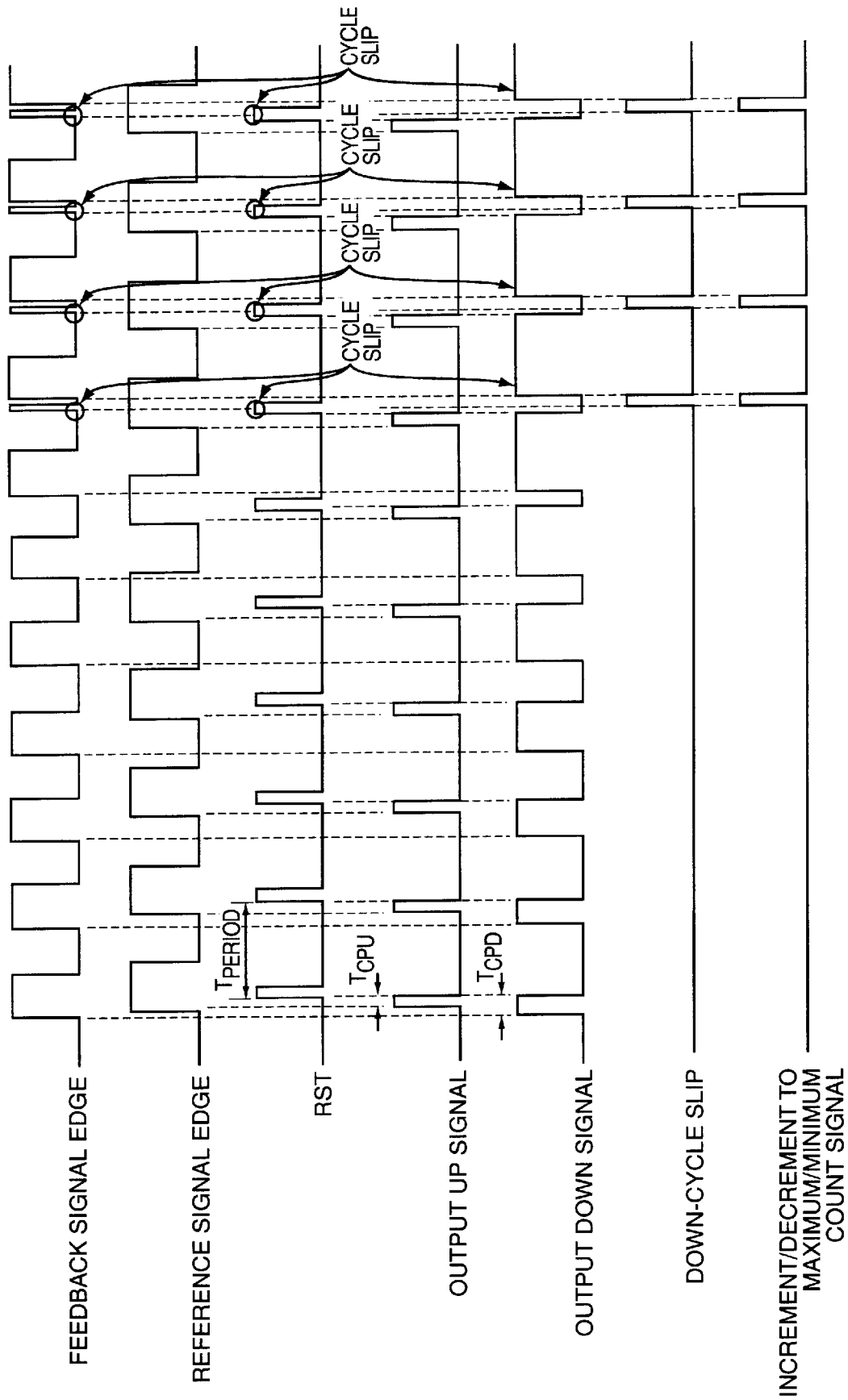
FIG. 5 is a diagram of relevant operating waveforms for the PFD of FIG. 2 illustrating cycle slip compensation.

FIG. 5 illustrates operation of the phase-reset circuit 30B in the role of cycle-slip compensator. As such, the diagram depicts the same waveforms as above, but adds the DOWN-CYCLE SLIP indicator provided by down-slip detector 20B. The up-slip detector 20A monitors for cycle slips in the reference signal, while the down-slip detector 20B monitors for cycle slip in the feedback signal. In the example, cycle slip occurs with respect to the feedback signal input, which means that the input flip-flop 32B of PFD 12 misses a clock edge in the feedback signal. The following operational discussion refers to cycle slips with respect to the feedback signal and involves the phase-reset circuit 30B, the input flip-flop 32B, and the down-slip detector 20B. However, it should be understood that the discussion applies equally to up-cycle slips in the reference signal involving the phase-reset circuit 30A, the input flip-flop 32A, and the up-slip detector 20A.

In the illustrated example, cycle slip occurs because a clock edge in the feedback signal occurs while the RST signal is asserted. The down-slip detector 20B detects this slip occurrence and asserts its DOWN-CYCLE SLIP indicator. The phase-reset circuit 30B receives the DOWN-CYCLE SLIP indicator, and sets its internal counter 38 to the value just before the counter's rollover point. For example, if the phase-reset circuit 30B operates as a down counter, it may set its internal counter 38 to the minimum value. Likewise, if it operates as an up counter, the phase-reset circuit 30B may set its internal counter 38 to the maximum value. In either case, this causes the phase-reset circuit 30B to issue an output clock edge in the reference signal on the next input clock edge in the output signal from the VCO 18, rather than after counting through another N clock edges in the output signal.

The effect of issuing a clock edge in the reference signal one clock cycle of the output signal after the missed clock cycle in the feedback signal is a reduction in the time it takes the PFD 12 to reassert its OUTPUT DOWN signal by (N−1) clock cycles of the output signal. Here, N is the number of count states in the counter 38 of the phase-reset circuit 30B. For example, assume that the counter 38 operates as a divide-by-100 counter. In this configuration, the phase-reset circuit 30B outputs one feedback signal clock cycle for every 100 output signal clock cycles. Absent cycle slip compensation, if the PFD 12 misses a feedback signal clock edge, it takes another 100 cycles of the output signal for the PFD 12 to receive the next feedback signal clock edge. By operation of the phase-reset circuit 30B, the PFD 12 receives the next feedback signal clock edge in $\frac{1}{100}^{th}$ (or some other reduced count value) of the uncompensated time.

As noted, the actual number of counter states implemented in the phase-reset circuits 30A and 306 varies by application, and depends upon the frequencies of the reference and VCO output signals. Also, it is not necessary to set the phase-reset value of the counter 38 upon occurrence of cycle slip to the absolute minimum or absolute maximum value. Depending upon the clock frequencies involved, it may be desirable to have the counter 38 set to a few counts before its rollover value.

Note that a typical RST signal pulse width may be on the order of 10 ns, which may result in one or both of the phase-reset circuits 30A and 30B re-issuing several output clock edges during the reset period. This causes subsequent clock edge(s) to be reissued until the original cycle slip condition is corrected.

While the phase-reset circuits 30A and 30B provide for compensation of cycle slips in the PFD 12, such compensation action requires detection of cycle slips as they occur. Given operation of the PFD 12, it was earlier noted that the PFD 12 experienced cycle slip whenever it received multiple clock edges on one input signal between RST signals, or when it received a clock edge on either input signal during a RST pulse. With this, the detection of cycle slip may be approached in a variety of ways. How cycle slip detection is realized determines the structure of the up-/down slip detectors 20A and 20B.

The co-pending application, entitled "PLL Cycle Slip Detection," illustrates an exemplary implementation for the up- and down-slip detectors 20A and 20B, and is incorporated herein by reference. Note that while shown separately, the cycle slip detectors 20A and 20B can be incorporated as part of the PFD 12, thus providing a circuit capable of detecting and compensating cycle slip occurrences. Also note that the present invention relates to the co-pending application entitled "Slip-Detecting Phase Detector and Method for Improving Phase-Lock Loop Lock Time," Ser. No. 09/432,987, which was filed on Nov. 2, 1999, and is also incorporated herein by reference.

Figure 6:
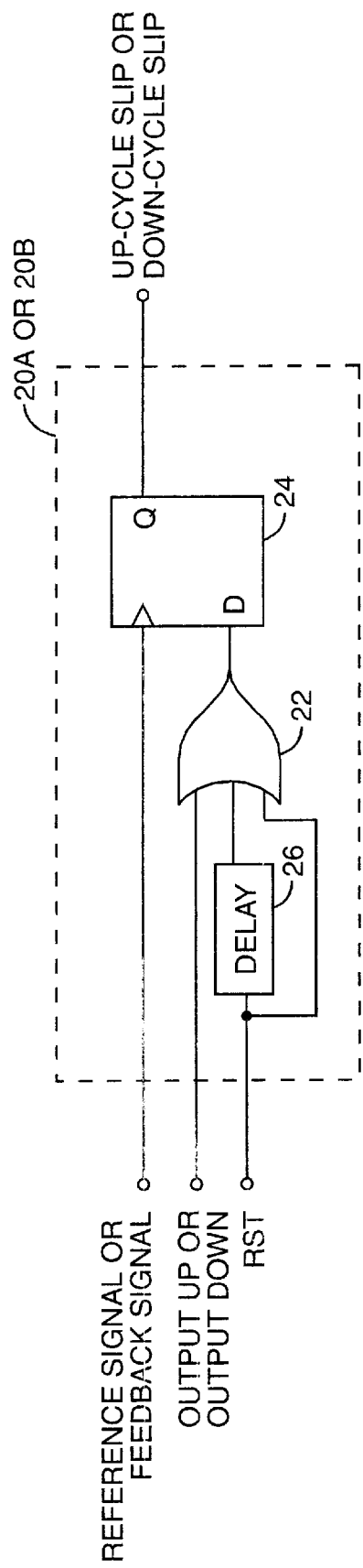
FIG. 6 is a diagram of the cycle slip detection circuitry in FIG. 1.

FIG. 6 diagrams an exemplary cycle slip detection structure that may apply to both the up-slip detector 20A and the down-slip detector 20B. Each slip detector 20 comprises a logic gate 22, an output flip-flop 24, and a delay element 26. Inputs to the logic gate 22 include the RST pulse from the reset circuit 33, a delayed version of the RST pulse, derived by passing the RST signal through the delay element 26, and one of the two PLL control signals, OUTPUT UP or OUTPUT DOWN.

The logic gate 22 provides an output signal that drives the data input of the output flip-flop 24. The output flip-flop 24 is clocked by one of the two input signals, either the reference signal or the feedback signal, depending on whether the cycle slip detector 20 is associated with the input flip-flop 32A or the input flip-flop 32B. The cycle slip indicator signal, either UP-CYCLE SLIP or DOWN-CYCLE SLIP, is asserted by the output flip-flop 24 whenever it receives a clock edge on its clock input while its data input is asserted. Since the logic gate 22 asserts this data input whenever the RST signal is asserted, or when the corresponding PFD input flip-flop's output is asserted, this operation detects input signal clock edges missed by the PFD 12.

Depending upon the timing characteristics of the input flip-flops 32A and 32B, they might not respond to an input signal clock edge if it occurs at or shortly after the falling edge of the RST pulse. Driving one of the inputs to the logic gate 22 with a delayed version of the RST pulse extends the hold time on the falling edge of the reset pulse, which extends the time that the data input of the output flip-flop 24 is asserted. This insures that the clock edge in the input signal that was missed by the input flip-flop 32A or 32B just as the RST pulse fell causes the output flip-flop 24 to assert its cycle slip indicator signal.

Figure 7:
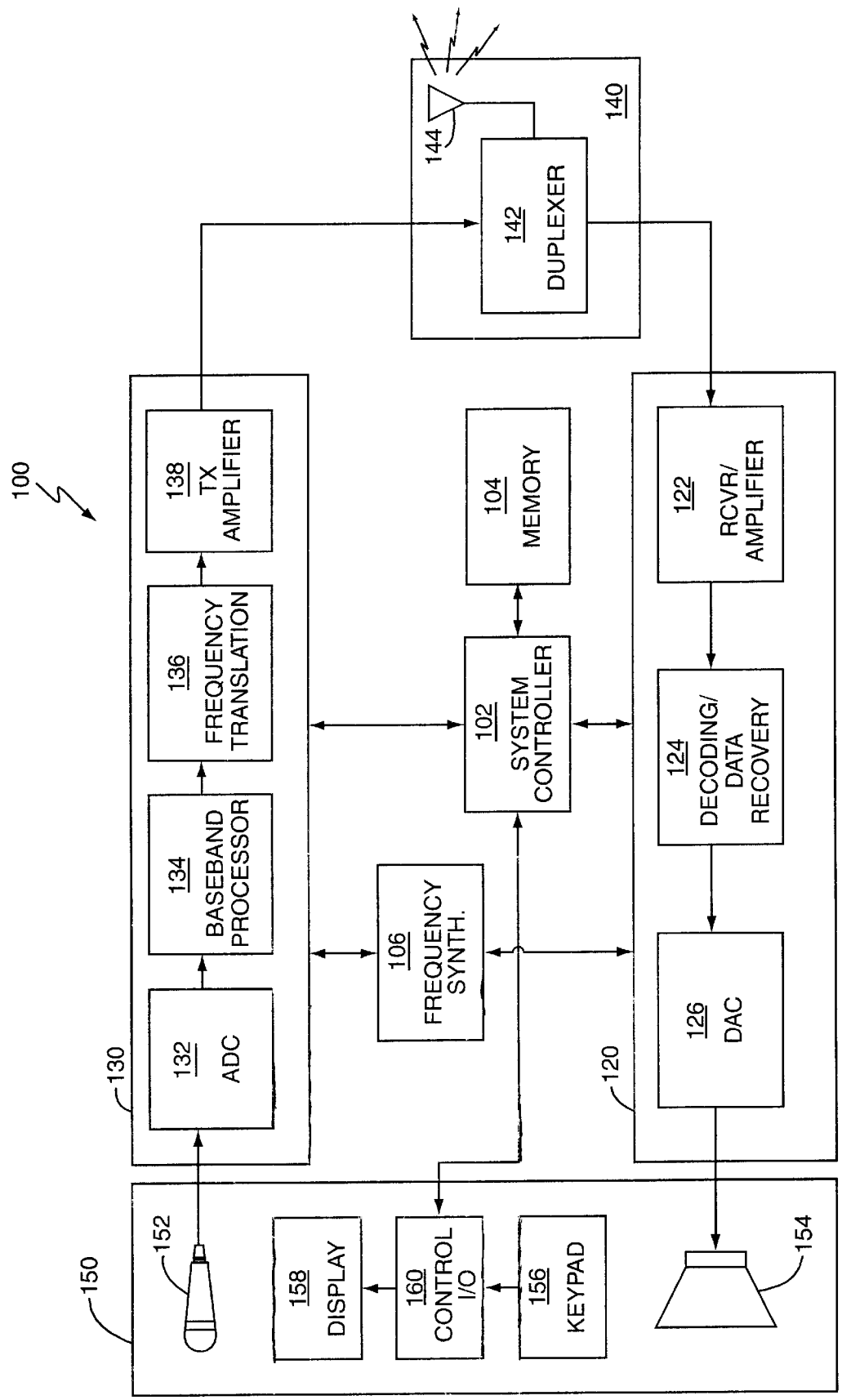
FIG. 7 is a diagram of a mobile terminal incorporating the PLL of FIG. 1.

FIG. 7 is a simplified diagram of a mobile terminal used in a wireless communications network, such as a cellular radiotelephone network, and is generally indicated by numeral 100. The mobile terminal 100 includes a system controller 102 and associated memory 104, a frequency synthesizer 106, a receiver 120, a transmitter 130, a duplexer/antenna 140, and a user interface 150. The frequency synthesizer 106 is implemented in accordance with the present invention.

In operation, the mobile terminal 100 sends and receives information via radio frequency signaling between it and a remote base station (not shown). The system controller 102 is typically implemented as one or more microcontrollers (MCUs) that manage the user interface 150, and provide overall control of the mobile terminal 100. The memory 104 generally includes application software, default values for constants used in operation, and working space for data.

The user interacts with the mobile terminal 100 via the user interface 150. The microphone 152 converts user speech signals into a corresponding analog signal, which is provided to the transmitter 130 for subsequent conversion, processing, and transmission to the remote base station via the duplexer/antenna 140. The receiver 120 received signals from the remote base station and extracts received audio information, e.g., speech from a remote user, and provides an audio signal for driving a speaker. 154 included in the user interface 150. The user interface 150 further includes a keypad 156 for accepting commands and data input from the user, and a display 158 for providing visual information to the user. In short, the user interface 150 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna 144, and the duplexer 142 provides signal isolation between received and transmitted signals. Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 154.

The transmitter 130 includes an ADC 132, a baseband processor 134, a frequency translation module 136, and a transmit amplifier 138. In operation, the ADC 132 converts analog speech signals from the microphone 152 to corresponding digital values. The baseband processor 134 processes and encodes these digital values, providing error correction encoding and translation into a format suitable for the frequency translation module 136. The frequency translation module 136 provides the transmit amplifier 138 with a modulated signal at the desired transmit frequency. In turn, the transmit amplifier 138 generates the RF output signal $RF_{out}$ for transmission to the remote base station via the duplexer/antenna 140.

The frequency synthesizer 106 provides one or more frequency signals for use in the mobile terminal 100. Typically, the frequency synthesizer 106 generates reference frequency signals that are used in down converting received signals, and in modulating or generating the transmit signal. The frequency synthesizer 106 uses one or more PLLs 10 to generate theses signals.

Figure 8:
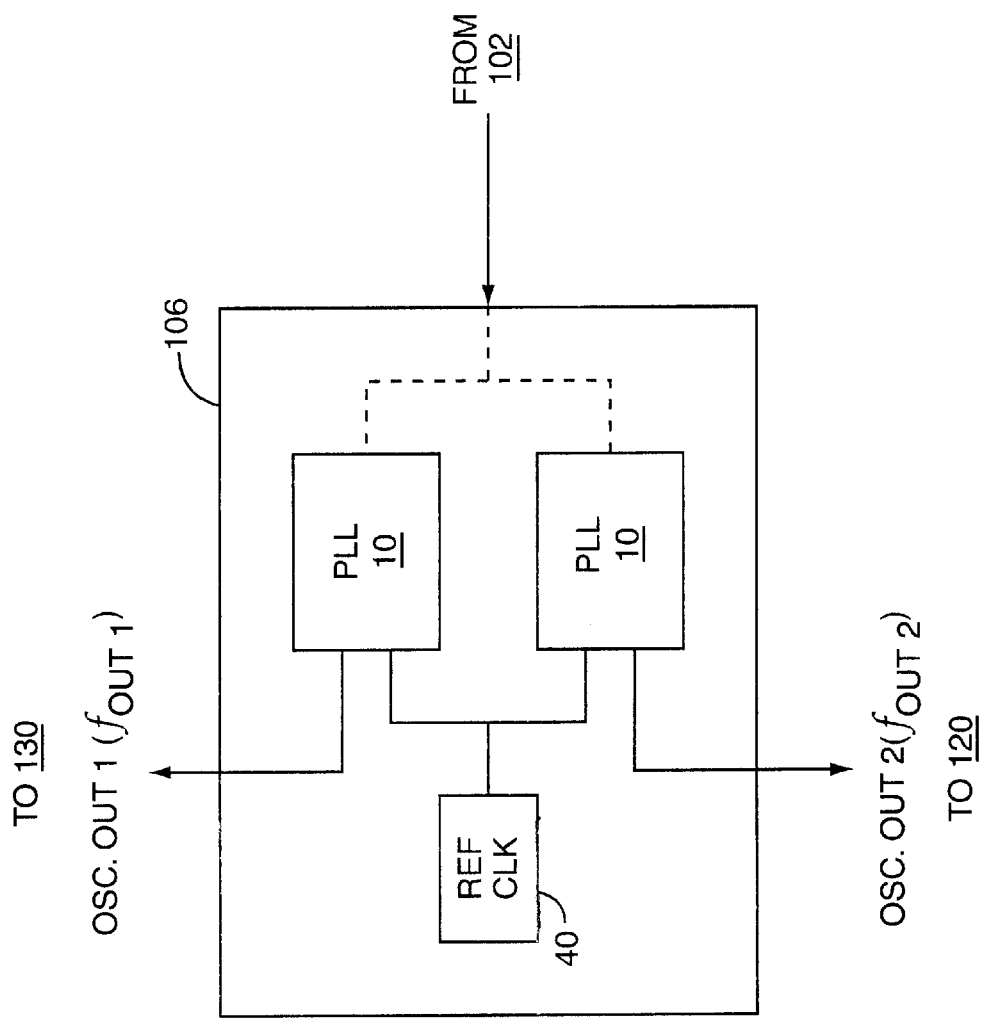
FIG. 8 is a diagram of the frequency synthesizer in the mobile terminal of FIG. 7.

FIG. 8 is a diagram of the frequency synthesizer 106. The frequency synthesizer 106 includes two or more PLLs 10 and a reference clock 40. At least one of the PLLs 10 incorporates the PFD 12 and cycle slip detectors 20A and 20B as discussed above. With regard to that earlier discussion, the upper PLL 10 derives its reference signal from the reference clock 40 and its feedback signal from the OSC OUT 1 output signal. Likewise, the lower PLL 10 derives its reference signal from the reference clock 40, and its feedback signal from the OSC OUT 2 signal. As noted above, the frequency synthesizer 106 may incorporate additional PLLs 10 to provide multiple reference frequencies for use in received signal processing or transmit signal generation.

The frequency synthesizer 106 typically operates under control of the MCU 102, with the MCU 102 setting, for example, the divider ratios used by the frequency divider circuits 30 in both PLLs 10 to control the frequency of the OSC OUT 1 and OSC OUT 2 signals. The cycle slip compensation provided by the phase-reset circuits 30A and 30B improves the response time of the frequency synthesizer 106 by reducing the amount of time required to bring the oscillator output signals provided to the transmitter 120 and receiver 130 into lock with the reference signal provided by the reference clock 40.

The present invention contemplates usage in a broad range of equipment types. Communication equipment, such as wireless network base stations and associated mobile terminals, might particularly benefit from incorporation of the present invention into their associated PLL circuits. Further, the present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A phase detector for use in a PLL comprising:

first and second input circuits to generate first and second PLL control signals responsive to clock edges in first and second input signals, respectively;

a reset circuit to generate a reset pulse based on said first and second PLL control signals to reset said first and second input circuits, thereby clearing said first and second PLL control signals;

a first frequency divider providing said first input signal to said first input circuit, said first frequency divider responsive to a first cycle slip indicator signal to advance a next clock edge in said first input signal; and a second frequency divider providing said second input signal to said second input circuit, said second frequency divider responsive to a second cycle slip indicator signal to advance a next clock edge in said second input signal;

wherein said first cycle slip indicator signal indicates that said phase detector missed a clock edge in said first input signal, and said second cycle slip indicator indicates that said phase detector missed a clock edge in said second input signal.

2. The phase detector of claim 1 wherein said first frequency divider comprises a divide-by-M counter clocked by a first clock signal and said second frequency divider comprises a divide-by-N counter clocked by a second clock signal, each one of said first and second frequency dividers operative to set a current count value to a predetermined value closer to a counter rollover value upon assertion of a respective one of said first and second cycle slip indicator signals.

3. The phase detector of claim 2 wherein said divide-by-M counter comprises a first digital counter, and wherein said first digital counter sets said current count value to said counter rollover value upon assertion of said first cycle slip indicator signal, thereby causing said first frequency divider to generate said next clock edge in said first input signal in response to a next clock edge in said first clock signal.

4. The phase detector of claim 2 wherein said divide-by-N counter comprises a second digital counter, and wherein said second digital counter sets said current count value to said counter rollover value upon assertion of said second cycle slip indicator signal, thereby causing said second frequency divider to generate said next clock edge in said second input signal in response to a next clock edge in said second clock signal.

5. The phase detector of claim 1 wherein said reset circuit comprises:
    a logic gate to assert a logic output of said logic gate whenever both said first and second PLL control signals are asserted; and
    a reset delay element to generate a reset signal a desired delay after assertion of said logic output from said logic gate, said first and second input circuits responsive to said reset signal to clear said first and second PLL control signals, causing said logic gate to de-assert said logic output, which in turn causes said reset delay element to clear said reset signal after said desired delay, thereby forming said reset pulse with a width defined by said desired delay.

6. The phase detector of claim 1 further comprising first and second cycle slip detectors corresponding to said first and second input circuits, respectively, each said cycle slip detector generating a corresponding one of said first and second cycle slip indicator signals based on said reset pulse, a corresponding one of said first and second input signals, and a corresponding one of said first and second PLL control signals.

7. The phase detector of claim 6 wherein each said cycle slip detector comprises slip detection logic to generate said slip indication signal when a clock edge in said corresponding one of said first and second input signals is received during said reset pulse.

8. The phase detector of claim 7 wherein said slip detection logic comprises a delay element to generate a delayed version of said reset pulse, and wherein said slip detection logic additionally generates said slip indication signal in response to receiving a clock edge in said corresponding one of said first and second input signals during said delayed version of said reset pulse.

9. The phase detector of claim 6 wherein each said cycle slip detector comprises slip detection logic to generate said slip indication signal when a clock edge in said corresponding one of said first and second input signals is received when said corresponding one of said first and second PLL control signals is asserted.

10. The phase detector of claim 6 wherein each cycle slip detector comprises slip detection logic, said slip detection logic comprising:
    an output flip-flop with a clock input coupled to said corresponding one of said first and second input signals; and
    a logic gate with a first logic input coupled to said reset pulse and a second logic input coupled to said corresponding one of said first and second PLL control signals, and with a logic output coupled to a data input of said output flip-flop, said logic gate operative to assert said logic output during said reset pulse and when said corresponding one of said first and second PLL control signals is asserted.

11. The phase detector of claim 10 wherein said slip detection logic further comprises a delay element coupled to said reset pulse and operative to generate a delayed version of said reset pulse, said logic gate including a third logic input coupled to said delay element to receive said delayed version of said reset pulse and operative to assert said logic output during said delayed version of said reset pulse.

12. The phase detector of claim 1 wherein each of said first and second input circuits comprises a latching circuit generating a corresponding one of said first and second PLL control signals as a latched output signal responsive to a first clock edge in a corresponding one of said first and second input signals.

13. The phase detector of claim 12 wherein said latching circuit comprises a reset input coupled to said reset pulse and operative to reset said latched output signal in response to said reset pulse, so that said latching circuit responds to a next clock edge in said corresponding one of said first and second input signals.

14. The phase detector circuit of claim 12 wherein said latching circuit comprises an input flip-flop configured such that:
    a data input of said input flip-flop is coupled to a fixed assertion signal;
    a data output of said input flip-flop is coupled to an input of said reset circuit;
    a clock input of said input flip-flop is coupled to said corresponding one of said first and second input signals; and
    a reset input coupled to a reset signal output of said reset circuit providing said reset pulse.

15. The phase detector circuit of claim 1 wherein said reset circuit comprises:
    a logic gate with first and second inputs coupled to said first and second PLL control signals from said first and second input circuits, and operative to assert an output signal when both said first and second control signals are asserted; and
    a delay element to generate said reset pulse a defined delay after assertion of said output signal from said logic gate.

16. A phase-locked loop (PLL) comprising:
    a phase detector to generate first and second PLL control signals based on a detected phase difference between respective clock edges in first and second input signals, said phase detector comprising:
        first and second input circuits to generate first and second PLL control signals responsive to clock edges in first and second input signals, respectively;
        a reset circuit to generate a reset pulse based on said first and second PLL control signals to reset said first and second input circuits, thereby clearing said first and second PLL control signals;
        a first frequency divider providing said first input signal to said first input circuit, said first frequency divider responsive to a first cycle slip indicator signal to advance a next clock edge in said first input signal; and
        a second frequency divider providing said second input signal to said second input circuit, said second frequency divider responsive to a second cycle slip indicator signal to advance a next clock edge in said second input signal; and
    a control circuit to generate a control signal based on said first and second PLL control signals; and
    a controllable oscillator to generate an output signal at a frequency based on said control signal.

17. The PLL of claim 16 wherein said first frequency divider comprises a divide-by-M counter clocked by a reference clock signal and said second frequency divider comprises a divide-by-N counter clocked by a frequency-controlled output of said PLL, each one of said first and second frequency dividers operative to set a current count value to a predetermined value closer to a counter rollover value upon assertion of a respective one of said first and second cycle slip indicator signals.

18. The PLL of claim 17 wherein said divide-by-M counter comprises a first digital counter, and wherein said first digital counter sets said current count value to said counter rollover value upon assertion of said first cycle slip indicator signal, thereby causing said first frequency divider to generate said next clock edge in said first input signal in response to a next clock edge in said reference clock signal.

19. The PLL of claim 17 wherein said divide-by-N counter comprises a second digital counter, and wherein said second digital counter sets said current count value to said counter rollover value upon assertion of said second cycle slip indicator signal, thereby causing said second frequency divider to generate said next clock edge in said second input signal in response to a next clock edge in said frequency-controlled output signal of said PLL.

20. The PLL of claim 16 wherein said reset circuit comprises:
a logic gate to assert a logic output of said logic gate whenever both said first and second PLL control signals are asserted; and
a reset delay element to generate a reset signal a desired delay after assertion of said logic output from said logic gate, said first and second input circuits responsive to said reset signal to clear said first and second PLL control signals, causing said logic gate to de-assert said logic output, which in turn causes said reset delay element to clear said reset signal after said desired delay, thereby forming said reset pulse with a width defined by said desired delay.

21. The PLL of claim 16 further comprising:
a first cycle slip detector generating said first cycle slip indicator signal based on said reset pulse, said first input signal, and said first PLL control signal; and
a second cycle slip detector generating said second cycle slip indicator signal based on said reset pulse, said second input signal, and said second PLL control signal.

22. The PLL of claim 21 wherein each said cycle slip detector comprises slip detection logic to generate said slip indication signal when a clock edge in said corresponding one of said first and second input signals is received during said reset pulse.

23. The PLL of claim 21 wherein said slip detection logic comprises a delay element to generate a delayed version of said reset pulse, and wherein said slip detection logic additionally generates said slip indication signal when a clock edge in said corresponding one of said first and second input signals is received during said delayed version of said reset pulse.

24. The PLL of claim 21 wherein each said cycle slip detector comprises slip detection logic to generate said slip indication signal when a clock edge in said corresponding one of said first and second input signals is received when said corresponding one of said first and second PLL control signals is asserted.

25. The PLL of claim 21 wherein each said cycle slip detector comprises slip detection logic, said slip detection logic comprising:

an output flip-flop with a clock input coupled to said corresponding one of said first and second input signals; and
a logic gate with a first logic input coupled to said reset signal and a second logic input coupled to said corresponding one of said first and second PLL control signals, and with a logic output coupled to a data input of said output flip-flop, said logic gate operative to assert said logic output during said reset pulse and when said corresponding one of said first and second PLL control signals is asserted.

26. The PLL of claim 25 wherein said slip detection logic further comprises a delay element coupled to said reset pulse and operative to generate a delayed version of said reset pulse, said logic gate including a third logic input coupled to said delay element to receive said delayed version of said reset pulse and operative to assert said logic output during said delayed version of said reset pulse.

27. The PLL of claim 16 wherein each of said first and second input circuits comprises a latching circuit generating a corresponding one of said first and second PLL control signals as a latched output signal responsive to a first clock edge in a corresponding one of said first and second input signals.

28. The PLL of claim 27 wherein said latching circuit comprises a reset input coupled to said reset circuit and operative to reset said latched output signal in response to said reset pulse, so that said latching circuit responds to a next clock edge in said corresponding one of said first and second input signals.

29. A radio frequency transceiver comprising:
a receiver to receive a remotely transmitted signal at a receive frequency;
a transmitter to generate a transmit signal at a carrier frequency; and
a frequency synthesizer to generate a first output signal bearing on said receive frequency and a second output signal bearing on said carrier frequency, said frequency synthesizer comprising:
a reference clock circuit to generate a reference clock signal; and
first and second phase-locked loops (PLLs) to generate said first and second output signals, respectively, at least one of said PLLs comprising:
a phase detector to generate first and second PLL control signals based on a detected phase difference between respective clock edges in first and second input signals, said first input signal derived from said reference clock signal and said second input signal derived from a corresponding one of said first and second output signals, said phase detector comprising:
first and second input circuits to generate first and second PLL control signals responsive to clock edges in first and second input signals, respectively;
a reset circuit to generate a reset pulse based on said first and second PLL control signals to reset said first and second input circuits, thereby clearing said first and second PLL control signals;
a first frequency divider providing said first input signal to said first input circuit, said first frequency divider responsive to a first cycle slip indicator signal to advance a next clock edge in said first input signal; and
a second frequency divider providing said second input signal to said second input circuit, said second frequency divider responsive to a second cycle slip indicator signal to advance a next clock edge in said second input signal; and a control circuit to generate a control signal based on said first and second PLL control signals; and a controllable oscillator to generate said corresponding one of said first and second output signals at a frequency based on said control signal.

30. The radio frequency transceiver of claim 29 wherein said at least one of said PLLs further comprises:

a first cycle slip detector generating said first cycle slip indicator signal based on said reset pulse, said first input signal, and said first PLL control signal; and a second cycle slip detector generating said second cycle slip indicator signal based on said reset pulse, said second input signal, and said second PLL control signal.

31. The radio frequency transceiver of claim 29 wherein said first frequency divider comprises a divide-by-M counter clocked by said reference clock signal and said second frequency divider comprises a divide-by-N counter clocked by said corresponding one of said first and second output signals, each one of said first and second frequency dividers operative to set a current count value to a predetermined value closer to a counter rollover value upon assertion of a respective one of said first and second cycle slip indicator signals.

32. A method of compensating for cycle slip in a PLL, the method comprising:

generating one clock pulse in a first input signal for every M clock pulses in a reference clock signal using a first frequency divider;

generating one clock pulse in a second input signal for every N clock pulse in an output signal of PLL using a second frequency divider;

advancing a current count value of said first frequency divider in response to a first cycle slip indicator signal to reduce the time before generating a next clock pulse in said first input signal; and advancing a current count value of said second frequency divider in response to a second cycle slip indicator to reduce the time before generating a next clock pulse in said second input signal.

33. The method of claim 32 wherein said advancing a current count value of said first frequency divider in response to said first cycle slip indicator signal to reduce the time before generating a next clock pulse in said first input signal comprises setting said current count value to a rollover value of said first frequency divider, such that a next clock pulse in said reference clock signal causes said first frequency divider to generate said next clock pulse in said first input signal.

34. The method of claim 32 wherein said advancing a current count value of said second frequency divider in response to said second cycle slip indicator signal to reduce the time before generating a next clock pulse in said second input signal comprises setting said current count value to a rollover value of said second frequency divider, such that a next clock pulse in said output signal of said PLL causes said second frequency divider to generate said next clock pulse in said second input signal.

35. The method of claim 32 further comprising:

detecting a phase difference between said respective clock pulses in said first and second input signals using a phase detector; and resetting said phase detector after each pair of respective clock pulses in said first and second input signals, such that said phase detector is responsive to subsequent respective clock pulses in said first and second input signals.

36. The method of claim 35 further comprising:

generating first and second PLL control signals as successive pulses with respective pulse widths based on relative arrival times between respective clock pulses in said first and second input signals subsequent to resetting said phase detector; and controlling a controllable oscillator that sets said frequency of said output signal based on said first and second PLL control signals.

37. The method of claim 36 further comprising generating a reset signal with a minimum reset pulse width to reset said phase detector, wherein said minimum reset pulse width establishes a minimum pulse width of pulses in said first and second PLL control signals that is independent of a minimum phase difference between said respective clock pulses in said first and second input signals.

38. The method of claim 35 further comprising generating said first cycle slip indicator signal when a clock pulse is received in said first input signal while resetting said phase detector.

39. The method of claim 35 further comprising generating said first cycle slip indicator signal when a clock pulse is received in said first input signal during a pulse of said first PLL control signal.

40. The method of claim 35 further comprising generating said second cycle slip indicator signal when a clock pulse is received in said second input signal while resetting said phase detector.

41. The method of claim 35 further comprising generating said second cycle slip indicator signal when a clock pulse is received in said second input signal during a pulse of said second PLL control signal.

* * * * *